United States Patent [19]

Ishii

[11] Patent Number: 5,445,708
[45] Date of Patent: Aug. 29, 1995

[54] METHOD FOR PREPARING ULTRATHIN PIEZOELECTRIC RESONATOR PLATES

[75] Inventor: Osamu Ishii, Kouza, Japan

[73] Assignee: Toyo Communication Equipment Co., Ltd., Kanagawa, Japan

[21] Appl. No.: 210,941

[22] Filed: Mar. 21, 1994

[30] Foreign Application Priority Data

Mar. 22, 1993 [JP] Japan .................. 5-108735
Mar. 2, 1994 [JP] Japan .................. 6-058115

[51] Int. Cl.⁶ .............................. B23P 15/00
[52] U.S. Cl. ........................... 216/17; 126/92
[58] Field of Search ............ 437/947; 156/640, 635, 156/644, 639, 643, 345

[56] References Cited

U.S. PATENT DOCUMENTS 3,694,677  9/1972  Guttwein ............... 310/9.6
4,502,932  3/1985  Kline ................. 204/192 EC
4,631,437  12/1986  Ballato ................ 310/369
5,271,798  12/1993  Sandhu ................ 156/345

FOREIGN PATENT DOCUMENTS 0140720  12/1983  Japan .................. 437/947

OTHER PUBLICATIONS

Wolf "Silicon Processing for the VLSI Era" vol. 1, pp. 520 & 529., 1987 Lattice Press.

Primary Examiner—R. Bruce Breneman
Assistant Examiner—Joni Y. Chang
Attorney, Agent, or Firm—Koda & Androlia

[57] ABSTRACT

A method for preparing ultrathin piezoelectric resonator plates having an ultrathin vibrating portion enclosed by a thick periphery portion, comprising a forming process which forms a plurality of depressions in one side of a wafer of a piezoelectric material to form ultrathin vibrating portions as the bottom wall of each depression and a trimming process which trims the thickness of each vibrating portion by etching to adjust the resonance frequency, characterized by bonding a comparatively thick plate with a plurality of holes formed at the positions corresponding to the depressions in the wafer to the depressed side of the wafer or forming a layer with a plurality of holes formed at the positions corresponding to the depressions in the wafer over the depressed side of the wafer, and putting an etching liquid into the depressions through the holes in the thick plate or layer.

By this method, excessive or incomplete trimming in the trimming process can be prevented and hence the yield rate of product increases.

4 Claims, 2 Drawing Sheets

METHOD FOR PREPARING ULTRATHIN PIEZOELECTRIC RESONATOR PLATES

BACKGROUND OF INVENTION

1. Field of Invention

This invention relates to a method for preparing ultrathin piezoelectric resonator plates, and particularly to a method for trimming the thickness of the vibrating portions of a plurality of ultrathin piezoelectric resonator plates formed in a wafer of a piezoelectric material without excessive or incomplete trimming.

2. Prior Art

As the demand for reduction in size or thickness or operation at higher frequencies of electronic instruments and apparatuses becomes severe, in addition to miniaturization of piezoelectric resonators used in oscillators or filters, raising of their resonance frequency and reduction of the temperature dependency of their resonance frequency are also required.

In view of this tendency, the inventor of this invention established a basic manufacturing process of an ultrathin piezoelectric resonator using AT-cut quartz crystals with a vibrating portion of about 15 μm in thickness enclosed by a thicker peripheral portion which has a fundamental vibration frequency higher than 100 MHz.

In the manufacturing process of the ultrathin piezoelectric resonator, a plurality of depressions are formed in one side of a wafer of a piezoelectric material to form ultrathin vibrating portions as the bottom wall of each depression. The thickness of the vibrating portions thus formed does not fall within a desired range of variation from a predetermined value. Therefore, the thickness of each vibrating portion is measured to determine the thickness trim and trimmed by etching. Since the distance between adjacent depressions is very small and the depth of depressions is only approximately 60 to 70 μm, there are the following problems with this trimming process: the etching liquid dropped in a depression can overflow into adjacent depressions; the vapor of the etching liquid corrodes the vibrating portions which do not need trimming and makes them too thin; and an insufficient dropping of the etching liquid can be caused by a slight fluctuation of the operation of the etching liquid dispenser and the sufficient amount of the etching liquid evaporates out before a determined etching time elapses to cause incomplete trimming.

SUMMARY OF THE INVENTION

The object of this invention is to provide a method for preparing ultrathin piezoelectric resonator plates which can solve the problems of the conventional trimming process as described above and increase the yield rate of products.

The method for preparing ultrathin piezoelectric resonator plates of this invention attains the above object by the trimming process, characterized by bonding a comparatively thick plate with a plurality of holes formed at the positions corresponding to the depressions in the wafer to the depressed side of the wafer or forming a layer with a plurality of holes formed at the positions corresponding to the depressions in the wafer over the depressed side of the wafer, and putting an etching liquid into the depressions through the holes in the thick plate or layer.

By this method, excessive or incomplete trimming in the trimming process can be prevented and hence the yield rate of product increases.

DETAILED DESCRIPTION OF PREFERRED EMBODIMENTS

Figure 1A:
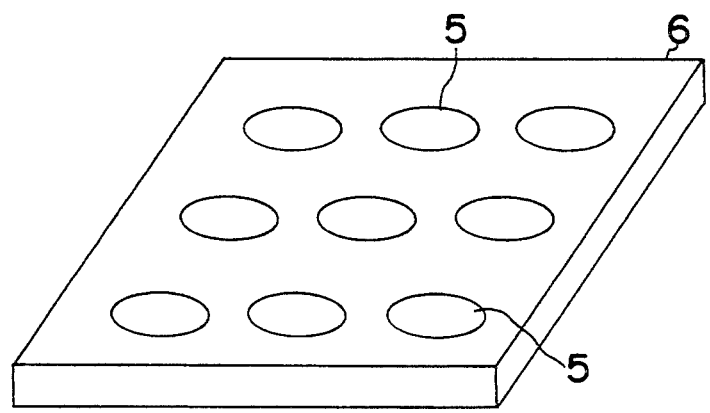
FIG. 1(a) is a perspective view of an embodiment of the thick plate with holes used for the method of this invention.

This invention is described below in detail using the embodiments shown in the drawings.

Prior to describing this invention, the conventional method of trimming the thickness of the vibrating portion of ultrathin piezoelectric resonator plates formed in a wafer is briefly explained to facilitate the understanding of this invention.

Figure 2A:
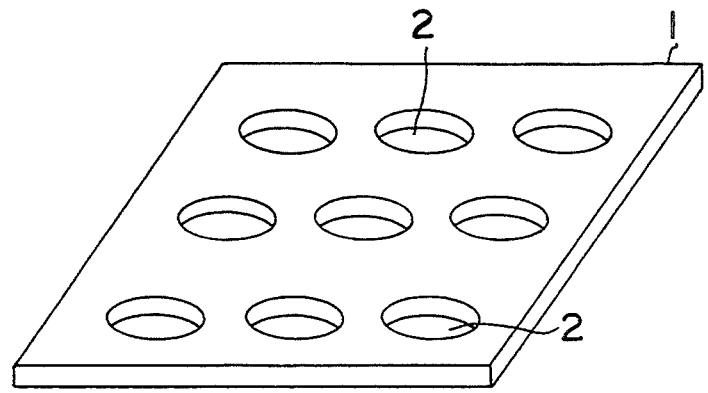
FIG. 2(a) is a perspective view of a wafer of a piezoelectric material in which a plurality of depressions are formed.

FIG. 2(a) shows a quartz wafer 1 in one side of which a plurality of depressions 2 is formed by a physical forming process. Ultrathin vibrating potions are formed as the bottom wall of each depression. It is practically impossible to form the vibrating portions in a thickness within a desired range of variation from is predetermined value by the forming process alone.

Figure 2B:
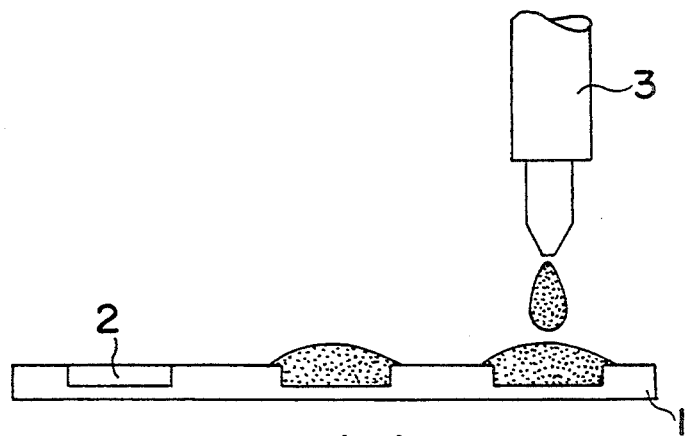
FIG. 2(b) is a sectional view which illustrates the trimming of the thickness of vibrating portion of ultrathin piezoelectric resonator plates formed in a wafer by the conventional method.

Therefore, the thickness of each vibrating portion is trimmed by the following method: first the resonance frequency of each vibrating portion is measured by putting electrodes into contact with both sides of each vibrating portion; the actual thickness of the bottom portion is calculated using the resonance frequency measured; the thickness to be trimmed is determined; an etching liquid 4 is dropped into the depressions 2 in order of the length of the necessary etching time by means of a dispenser as shown in FIG. 2(b); and when a predetermined time elapses after the dropping of the etching liquid is completed, the wafer 1 is washed. Since the depth of the depressions 2 is only approximately 60 to 70 μm and the depressions are very closely located (the plane dimensions of the resonator elements when they are cut from the wafer 1 are 3 mm×3 mm), there are the following problems with this trimming process: the etching liquid dropped in a depression can overflow into adjacent depressions; the vapor of the etching liquid corrodes the vibrating portions which do not need trimming and makes them too thin; and an insufficient dropping of the etching liquid can be caused by a slight fluctuation of the operation of the etching liquid dispenser and the sufficient amount of the etching liquid evaporates out before a determined etching time elapses to cause incomplete trimming. These problems decrease the yield rate of the products.

This invention solves the above problems by the following method.

Figure 1B:
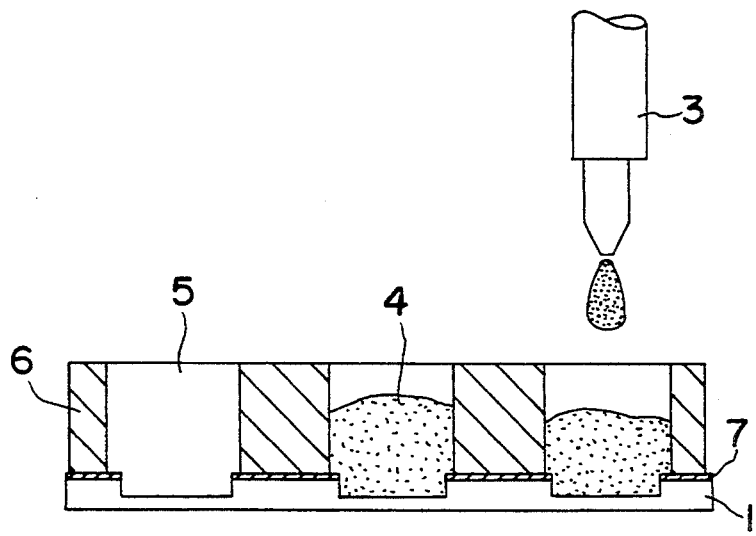
FIG. 1(b) is a sectional view which illustrates the trimming of the thickness of the vibrating portion of ultrathin piezoelectric resonator plates formed in a wafer by the method of this invention.

A thick plate of Bakelite 6 with a plurality of holes 5 formed at the positions corresponding to the depressions 2 in the wafer 1 as shown in FIG. 1(a) is attached to the depressed side of the wafer 1 by means of an adhesive 7, and the etching liquid 4 is dropped in the depressions 2 through the holes 5 as shown in FIG. 1(b).

This eliminates the anxiety that the etching liquid dropped into a depression 2 overflows into adjacent depressions 2 if an excessive amount of the etching liquid is dropped. As the result, the control of the dispenser becomes easier and reduction of the cost of the manufacturing equipment is made possible.

Further, since a sufficient amount of the etching liquid can be dropped into the depressions 2, incomplete trimming of the bottom wall of the depressions 2, caused by an insufficient amount of the liquid evaporating out in the middle course of etching can be prevented.

Moreover, the flow of the vapor of the etching liquid from depressions 2 being trimmed into depressions whose bottom wall does not need trimming becomes difficult. As the result, excessive trimming by the vapor of the etching liquid can also be prevented.

Described above is an embodiment of this invention, to which this invention is not limited. The thick plate with a plurality of holes may be formed of a material such as Teflon which is not eroded by the etching liquid used for the trimming. The thickness of approximately 5 to 10 mm is adequate for the thick plate with a plurality of holes. To bond the thick plate and the wafer, any adhesive which is not eroded by the etching liquid used and has a solvent able to readily separate the thick plate and the wafer can be used. A thick layer with a plurality of holes which performs the same function as the plate may be formed of a material applicable thick over the wafer by printing, instead of using a separate plate.

Figure 3:
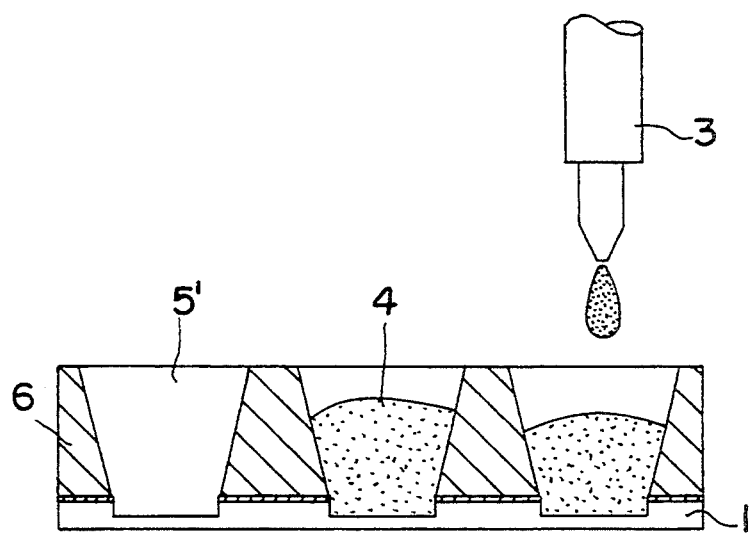
FIG. 3 is a sectional view which illustrates the trimming of the thickness of the vibrating portion of ultrathin piezoelectric resonator plates formed in a wafer using another embodiment of the thick plate with holes for the method of this invention.

The holes of the thick plate may be formed in an appropriate shape and arrangement according to the shape and arrangement of the depressions formed in wafers. By forming the holes 5' with a larger diameter at the top and a smaller diameter at the bottom in the thick plate 6 as shown in FIG. 3, for example, it becomes possible to drop the etching liquid exactly into comparatively small depressions by a dispenser with low precision positioning control.

Figure 1C:
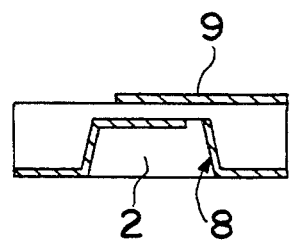
FIG. 1(c) is a sectional view of an ultrathin piezoelectric resonator produced.

After the trimming of the thickness of the vibrating portions is completed, the thick plate 6 is detached from the wafer 1 with a solvent, an overall electrode 8 is formed by vapor-depositing aluminum over the entire surface of the depressed side, and a partial electrodes 9 are formed by vapor deposition with a mask or photo-etching on the flat side at the positions corresponding to the central portion of the bottom of each depression 2. The wafer is then cut along the boundary between adjacent depressions 2 in the vertical and horizontal directions, and the ultrathin piezoelectric resonator elements as shown in FIG. 1(c) are obtained. These elements are housed in a package, and necessary wiring is made. Then a final adjustment of the resonance frequency is performed by additional vapor deposition on the electrodes.

Since this invention trims the resonance frequency of ultrathin piezoelectric resonator plates by the method as described above, it can prevent excessive and incomplete etching which occurs in the conventional trimming method by use of a simple jig and an increase of a few steps, thereby significantly raising the yield rate of products.

I claim:

1. A method for preparing ultrathin piezoelectric resonator plates having an ultrathin vibrating portion enclosed by a thick periphery portion, comprising forming a plurality of depression in one side of a wafer of a piezoelectric material to form ultrathin vibrating portions as a bottom wall of each depression and trimming a thickness of each vibrating portion by etching to adjust the resonance frequency, characterized by bonding a thick plate having a thickness substantially thicker than said wafer with a plurality of holes formed at the positions corresponding to the depressions in the wafer to the depressed side of the wafer, and putting an etching liquid into the depressions through the holes in the thick plate.

2. A method according to claim 1 wherein the thickness of said thick plate is 5 to 10 millimeters.

3. A method for preparing ultrathin piezoelectric resonator plates having an ultrathin vibration portion enclosed by a thick periphery portion, comprising forming a plurality of depressions in one side of a wafer of a piezoelectric material to form ultrathin vibration portions as a bottom wall of each depression and trimming a thickness of each vibrating portion by etching to adjust the resonance frequency, characterized by forming a thick layer having a thickness substantially thicker than said wafer with a plurality of holes formed at the positions corresponding to the depressions in the wafer over the depressed side of the wafer, and putting an etching liquid into the depressions through the holes in the layer.

4. A method according to claim 3 wherein the thickness of said layer is 5 to 10 millimeters.

* * * * *